United States Patent [19]

Kim et al.

[11] Patent Number: 5,534,728
[45] Date of Patent: Jul. 9, 1996

[54] SEMICONDUCTOR DEVICE HAVING A CORROSION-RESISTANT METAL WIRING LAYER

[75] Inventors: Tae-ryong Kim, Kyungki-do; Hee-su Park; Dai-sick Moon, both of Seoul, all of Rep. of Korea

[73] Assignee: Samsung Electronics Co., Ltd., Kyungki-do, Rep. of Korea

[21] Appl. No.: 947,640

[22] Filed: Sep. 21, 1992

[30] Foreign Application Priority Data

Sep. 19, 1991 [KR] Rep. of Korea ............... 91-16426

[51] Int. Cl.[6] .................................................. H01L 27/02
[52] U.S. Cl. ......................................................... 257/692
[58] Field of Search .................................. 257/668, 700, 257/734, 778, 773, 692

[56] References Cited

U.S. PATENT DOCUMENTS

| | | | |
|---|---|---|---|
| 4,489,365 | 12/1984 | Daberoke | 361/403 |
| 5,028,987 | 7/1991 | Eguchie | 257/734 |
| 5,032,890 | 7/1991 | Ushiku et al. | 257/700 |

*Primary Examiner*—William L. Sikes
*Attorney, Agent, or Firm*—Robert A. Westerlund; Stephen R. Whitt; Charles R. Donohoe

[57] ABSTRACT

A semiconductor device includes a metal wiring layer having a plurality of parallel, actual metal lines, with an endmost one of the actual metal lines being disposed adjacent a wiring-free region. The actual metal lines are electrically connected to an active circuit portion of the semiconductor device. At least one dummy metal line is interposed between the endmost one of the actual metal lines and the wiring-free region, with the at least one dummy metal line being disconnected from the active circuit portion. The dummy metal line(s) serve to prevent corrosion of the actual metal lines when the metal wiring layer is patterned by an etching process.

10 Claims, 3 Drawing Sheets

A

B

SEMICONDUCTOR DEVICE HAVING A CORROSION-RESISTANT METAL WIRING LAYER

BACKGROUND OF THE INVENTION

The present invention relates generally to semiconductor devices, and more particularly, to a semiconductor device having a metal wiring layer which utilizes a dummy metal pattern to enhance the corrosion-resistance and reliability thereof.

As semiconductor technology continues to evolve towards higher integration density devices, the width of the metal lines of the metal wiring layer thereof continues to be reduced or thinned. This thinning of the metal lines degrades the reliability of the metal wiring layer. More particularly, thinner metal lines are especially susceptible to destructive corrosion which can occur when the metal wiring layer is exposed to air following a reactive ion etching (RIE) process carried out in a plasma containing chlorine (Cl) or other type of caustic etchant. The corrosion is caused by residual chlorine or chlorine compounds left on the wafer surface of the semiconductor device following the etching process reacting with moisture in the air and thereby hydrolyzing to form hydrochloric acid (HCl). The hydrochloric acid corrodes weak or unprotected portions of the sidewalls of the metal lines where a protective native oxide has been incompletely formed. Corrosion proceeds rapidly as a result of this electrochemical reaction. If the metal bonding pad portions of the metal wiring layer are corroded, then the bondability of the semiconductor device will be degraded, and if the metal line pattern of the metal wiring layer is corroded, the likelihood of open lines and thus, failure of the semiconductor device is dramatically increased. Thus, it can be appreciated that corrosion of the metal bonding pads and/or the metal lines of the metal wiring layer of a semiconductor device can significantly degrade the performance and reliability of the device.

One technique which has been proposed to alleviate the above-described metal wiring layer corrosion problem is to replace chlorine (Cl) radicals formed during the RIE process utilizing a chlorine-containing plasma, with fluorine (F) radicals, by utilizing a fluorine-containing plasma such as $CF_4$ in place of the chlorine-containing plasma. Using this technique, instead of chlorine radicals being formed on the sidewalls of the metal lines and bonding pads of the metal wiring layer, fluorine radicals are formed thereon. The fluorine radicals are generally less reactive with the metal, e.g., aluminum (Al) or aluminum alloy (e.g., Al-1%Si, Al-1%Si-0.5%Cu), of the metal wiring layer, and thus, less corrosive. In one variation of this technique, a $CHF_3$ RIE plasma is used, to thereby form a chemically stable $AlF_3$ protective coating on the surface of the metal wiring layer, thereby further minimizing corrosion thereof.

However, the above-described technique requires that the etching process parameters (e.g., time, pressure, temperature, amount of etchant gas, magnitude of external power source, thickness and composition of photoresist, etc.) be tightly controlled, and therefore, unduly complicates the manufacturing process. Moreover, this technique has proven not to be entirely effective in eliminating the corrosion problem. Additionally, this technique is difficult to control to the extent required to maintain precise control over the geometry of the metal wiring layer, e.g., the uniformity of the width and spacing of the metal lines thereof. Because of these non-uniformities, the protective layer formed on the sidewalls of the metal lines and bonding pads of the metal wiring layer are also non-uniform, thereby resulting in local corrosion thereof. This local corrosion phenomenon is depicted in FIG. 1, where the white lines represent aluminum metal lines of the metal wiring layer of a semiconductor device. As can be seen, the local corrosion phenomenon causes a break or opening of one of the metal lines at a point indicated by the reference character A. This local corrosion phenomenon is also depicted in FIG. 2, where it can be seen that the one of a plurality of parallel metal lines adjoining a wide open area is broken at a point indicated by the reference character B.

Based upon the foregoing, it is evident that there presently exists a need for a semiconductor device having a metal wiring layer which overcomes the deficiencies of the metal wiring layer of presently available semiconductor devices. The present invention fulfills this need.

SUMMARY OF THE INVENTION

The present invention encompasses a semiconductor device includes a metal wiring layer having a plurality of parallel, actual metal lines, with an endmost one of the actual metal lines being disposed adjacent a wiring-free region. The actual metal lines are electrically connected to an active circuit portion of the semiconductor device. At least one dummy metal line is interposed between the endmost one of the actual metal lines and the wiring-free region, with the at least one dummy metal line being disconnected from the active circuit portion. The dummy metal line(s) serve to prevent corrosion of the actual metal lines when the metal wiring layer is patterned by an etching process.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 3:
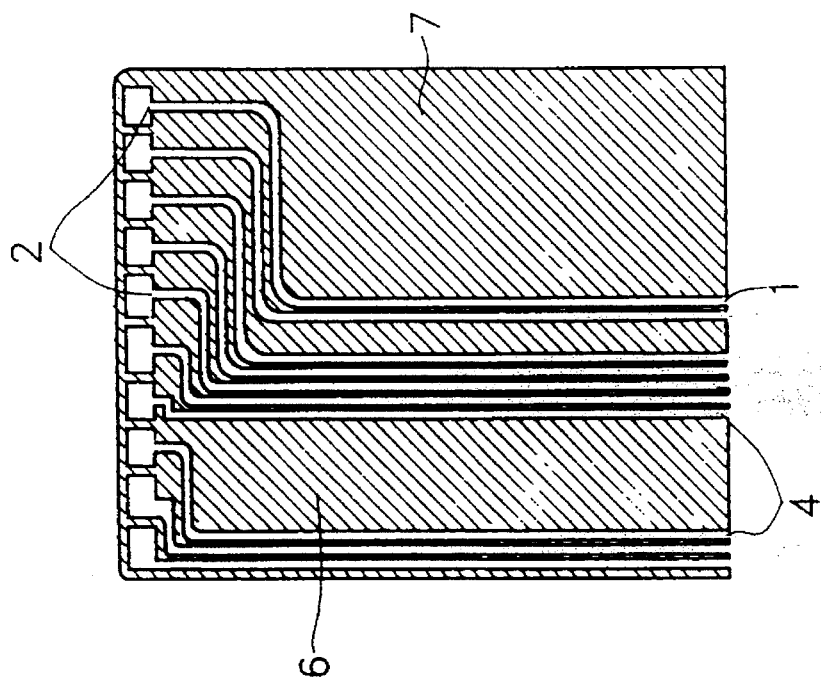
FIG. 3 depicts a first conventional metal wiring layer of a semiconductor device.

With reference now to FIG. 3, there can be seen a conventional metal wiring layer having a typical pattern. More particularly, the conventional metal wiring layer includes parallel metal lines 4 separated by a relatively wide wiring-free portion 6, a metal line 1 which immediately adjoins another relatively wide wiring-free portion 7, and parallel short metal wire segments 2 which are the end portions of the metal lines 1 and 4. The metal lines 4 are equally spaced-apart by a first distance interval, and the metal wire segments 2 are equally spaced-apart by a second distance interval.

Figure 1:
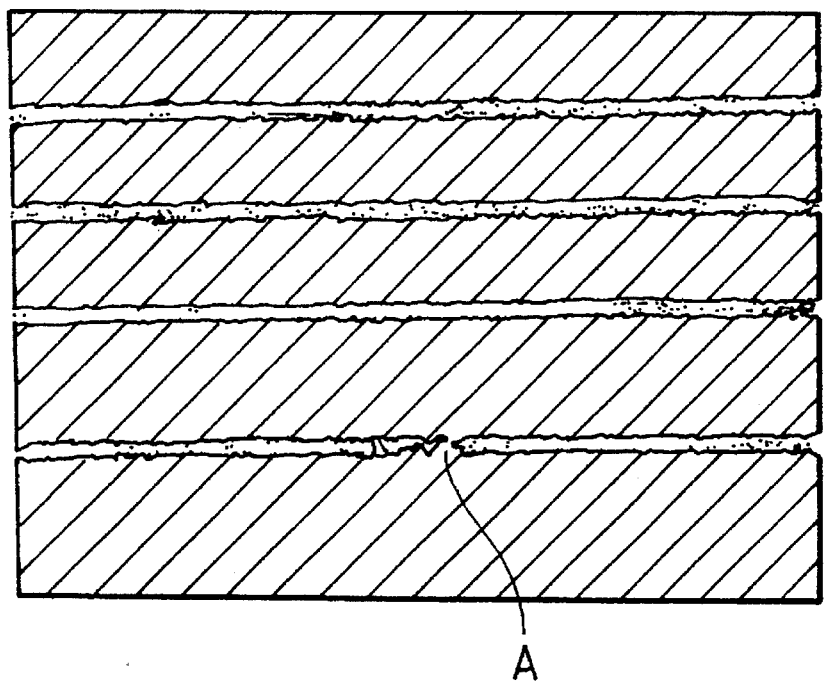
FIGS. 1 and 2 depict metal wiring layers of presently available semiconductor devices, and the local corrosion of metal lines thereof.
Figure 2:
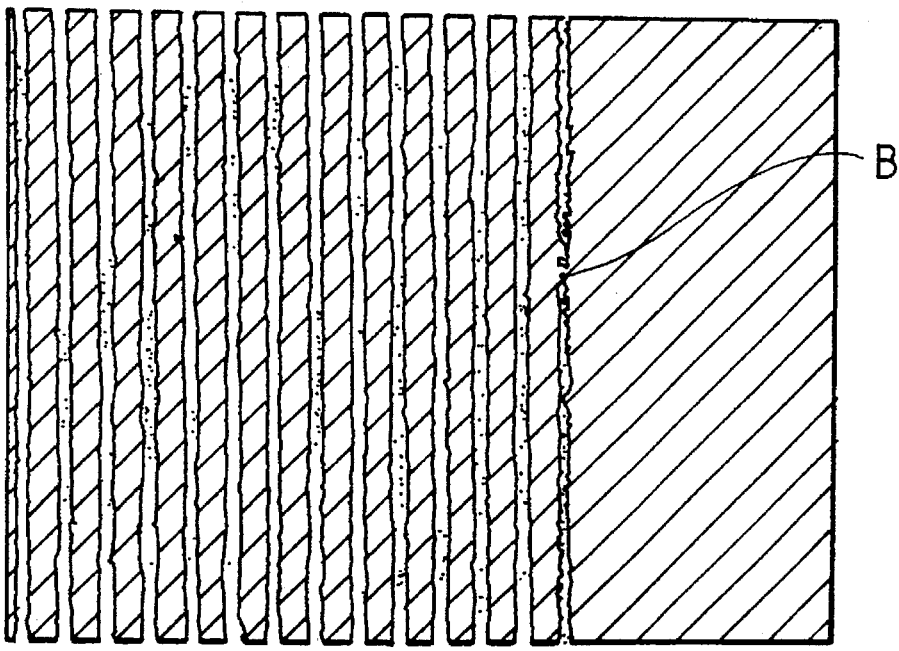
Figure 4:
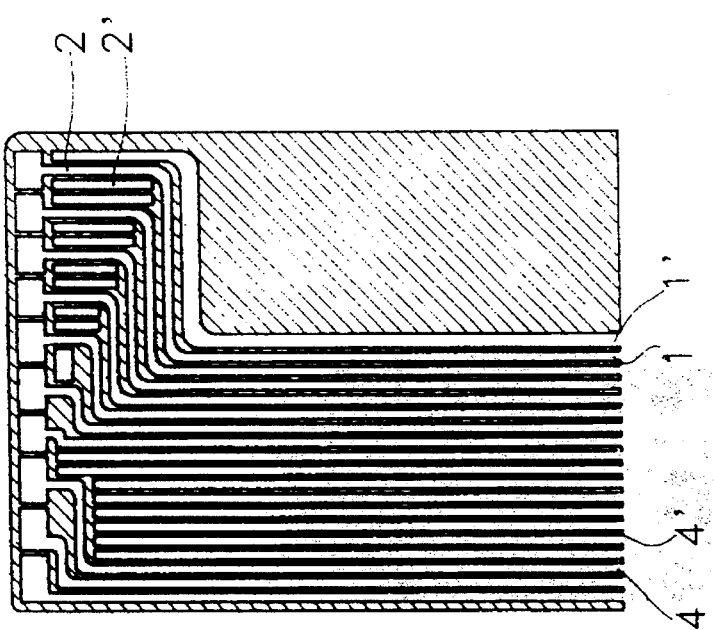
FIG. 4 depicts the metal wiring layer of a first preferred embodiment of the present invention, having the same actual metal wiring pattern as that of the metal wiring layer depicted in FIG. 3.

With reference now to FIG. 4, there can be seen the metal wiring layer of a first preferred embodiment of the present invention, having the same actual metal wiring pattern as the conventional metal wiring layer depicted in FIG. 3, but having additional parallel metal lines 4' interposed between respective ones of the metal lines 4, in the wiring-free region 6, and additional parallel short metal wire segments 2' interposed between respective ones of the metal wire segments 2. The additional metal lines 4' and the additional metal wire segments 2' are electrically disconnected from an active circuit portion (not shown) of the semiconductor device, and thus, can be considered dummy metal lines 4' and dummy metal wire segments 2'. Preferably, all of the actual metal lines 4 and the dummy metal lines 4' are equally spaced-apart by the first distance interval, and are preferably of the same, uniform width, although this is not limiting to the present invention. Also, preferably, the dummy wire segments 2' are equally spaced-apart from each other and from the actual metal wire segments 2 by a third distance interval which is the same or substantially the same as the first distance interval, although this is not limiting to the present invention. Further, as shown, a dummy metal line 1' is preferably provided adjacent the metal line 1, and is preferably made wider than all of the other metal lines.

As will be appreciated, the dummy metal line 1', the dummy metal lines 4', and the dummy metal segments 2' serve to protect the sidewalls of the actual metal line 1, the actual metal lines 4, and the actual metal segments 2, respectively, when the entire metal wiring layer is being patterned by an etching process, such as an RIE process. In this connection, the dummy metal lines 1', 4' and the dummy metal segments 2' prevent their counterpart actual metal lines and metal segments from being attacked by corrosion during the etching process, by ensuring that a protective layer (e.g., native oxide layer) is uniformly formed to an adequate thickness on at least the sidewall surfaces of the actual metal lines 1,4, and metal segments 2. It should be noted that the metal lines disposed adjacent to wiring-free regions are most susceptible to corrosion during etching.

Figure 5:
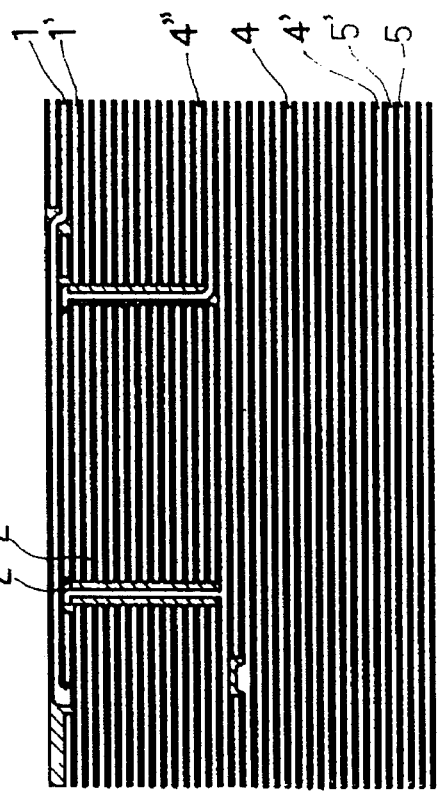
FIG. 5 depicts a second conventional metal wiring layer of a semiconductor device; and, FIG. 6 depicts the metal wiring layer of a second preferred embodiment of the present invention, having the same actual metal wiring pattern as that of the metal wiring layer depicted in FIG. 5.

With reference now to FIG. 5, there can be seen another conventional metal wiring layer having another typical pattern. More particularly, this metal wiring layer includes parallel metal lines 1, parallel metal lines 4, parallel metal lines 5, and parallel metal segments 2. An endmost one of the metal lines 1 and a first endmost one of the metal lines 4 are separated by a relatively wide, wiring-free region 8, and an endmost one of the metal lines 5 and a second endmost one of the metal lines 4 are separated by a relatively narrow, wiring-free region 9. As discussed above, it is these endmost ones of the metal lines 1,4, and 5 which are most susceptible to corrosive attack during etching, as well as the metal segments 2, which are all disposed in the wiring-free region 8.

Figure 6:
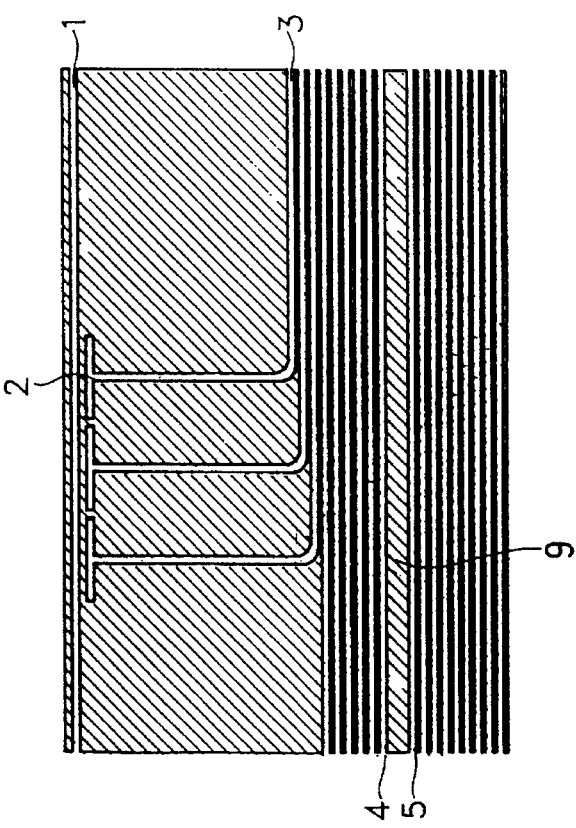

With reference now to FIG. 6, there can be seen a metal wiring layer of a second preferred embodiment of the present invention, having the same actual metal wiring pattern as the conventional metal wiring layer depicted in FIG. 5 (except that the middle one of the metal segments 2 has not been shown), but having additional, dummy metal lines and segments 1', 2', 4', and 5'. The dummy metal line 4' are disposed adjacent to the second endmost one of the actual metal lines 4, and the dummy metal line 5' is disposed adjacent to the endmost one of the actual metal lines 5, in the wiring-free region 9. The dummy wire segments 2' are disposed on opposite sides of the actual wire segments 2, in the wiring-free region 8. The dummy metal line 1' is disposed adjacent to the endmost one of the actual metal lines 1, in the wiring-free region 8. The dummy metal lines 4" are disposed between the dummy metal line 1' and the first endmost actual metal line 4, in the wiring-free region 8.

The terms "wiring-free region" and "normally wiring-free region" used in the specification and claims is hereby defined as a region of the surface of the semiconductor device which is devoid of any "actual metal lines" and thus, which would normally, i.e., in conventional semiconductor devices, be wiring-free.

Based upon the foregoing, it should be recognized that the present invention enables a corrosion-resistant metal wiring layer to be etched using conventional etching processes, e.g., using a chlorine-containing plasma, without modifying the basic parameters of the etching process, thereby ensuring that the geometry of the resultant patterned metal wiring layer can be precisely controlled, thereby enhancing the performance and reliability of the semiconductor device.

The term "actual metal lines" as used throughout the specification and claims is hereby defined as metal lines which are electrically connected to the active circuitry of the semiconductor device, and the term "dummy metal lines" is hereby defined as metal lines which are not electrically connected to the active circuitry of the semiconductor device.

Although two preferred embodiments of the present invention have been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A semiconductor device including:

a metal wiring layer having a plurality of parallel, actual metal lines, with an endmost one of said actual metal lines being disposed adjacent to a first wiring-free region;

an active circuit portion, said actual metal lines being electrically connected to said active circuit portion; and, at least one dummy metal line interposed between said endmost one of said actual metal lines and said wiring-free region, said at least one dummy metal line being electrically disconnected from said active circuit portion.

2. The device as set forth in claim 1, wherein actual metal lines are substantially equally spaced-apart by a first distance interval.

3. The device as set forth in claim 2, wherein said at least one dummy metal line is spaced-apart from said endmost actual metal line by said first distance interval.

4. The device as set forth in claim 3, wherein said at least one dummy metal line is of the same width as that of said actual metal lines.

5. The device as set forth in claim 3, wherein said at least one dummy metal line is of a greater width than that of said endmost actual metal line.

6. The device set forth in claim 1, further including a plurality of parallel, actual metal segments comprising end portions of said actual metal lines, said actual metal segments being substantially equally spaced-apart from each other by a second distance interval.

7. The device as set forth in claim 6, further including a plurality of dummy metal segments interposed between adjacent ones of said actual metal segments, said actual metal segments being electrically connected to said active circuit portion, and said dummy metal segments being electrically disconnected from said active circuit portion.

8. The device as set forth in claim 7, wherein said dummy metal segments are spaced-apart from said actual metal segments by said first distance interval.

9. The device as set forth in claim 1, wherein said plurality of actual metal lines comprises a first plurality of actual metal lines and a second plurality of actual metal lines separated from each other by a second wiring-free region, and further including a plurality of additional dummy metal lines disposed in said second wiring-free region.

10. The device as set forth in claim 9, wherein said plurality of additional dummy metal lines are substantially equally spaced-apart from each other and from said actual metal lines by said first distance interval.

* * * * *